United States Patent
Song et al.

(10) Patent No.: US 8,889,535 B2
(45) Date of Patent: Nov. 18, 2014

(54) SEMICONDUCTOR DEVICE AND METHOD FOR FABRICATING SEMICONDUCTOR BURIED LAYER

(75) Inventors: Hua Song, Wuxi (CN); Hsiao-Chia Wu, Wuxi (CN); Tse-Huang Lo, Wuxi (CN)

(73) Assignees: CSMC Technologies FAB1 Co., Ltd., Wuxi (CN); CSMC Technologies FAB2 Co., Ltd., Wuxi (CN)

( * ) Notice: Subject to any disclaimer, the term of this patent is extended or adjusted under 35 U.S.C. 154(b) by 111 days.

(21) Appl. No.: 13/807,305

(22) PCT Filed: Sep. 1, 2011

(86) PCT No.: PCT/CN2011/079261
§ 371 (c)(1),
(2), (4) Date: Dec. 28, 2012

(87) PCT Pub. No.: WO2012/028110
PCT Pub. Date: Mar. 8, 2012

(65) Prior Publication Data
US 2013/0134562 A1    May 30, 2013

(30) Foreign Application Priority Data
Sep. 1, 2010 (CN) .......................... 2010 1 0268643

(51) Int. Cl.
  *H01L 21/425* (2006.01)
  *H01L 21/265* (2006.01)
  *H01L 21/74* (2006.01)
  *H01L 29/02* (2006.01)
  *H01L 29/08* (2006.01)

(52) U.S. Cl.
  CPC .............. *H01L 21/265* (2013.01); *H01L 21/74* (2013.01); *H01L 29/02* (2013.01); *H01L 21/26513* (2013.01); *H01L 29/0821* (2013.01)
  USPC .......................................... 438/514; 257/632

(58) Field of Classification Search
  None
  See application file for complete search history.

(56) References Cited

U.S. PATENT DOCUMENTS

| 2002/0079554 A1 * | 6/2002 | Okawa et al. ................. 257/565 |
| 2007/0045631 A1 * | 3/2007 | Endo et al. ...................... 257/77 |
| 2008/0272400 A1 * | 11/2008 | Adkisson et al. ............. 257/233 |

FOREIGN PATENT DOCUMENTS

CN    1632944 A    6/2005

\* cited by examiner

*Primary Examiner* — Julio J Maldonado
*Assistant Examiner* — Robert Bachner
(74) *Attorney, Agent, or Firm* — Anova Law Group, PLLC

(57) ABSTRACT

The present disclosure provides a semiconductor device and a method for fabricating a semiconductor buried layer. The method includes: preparing a substrate which includes a first oxide layer; forming a first buried layer region in the surface of the substrate by using a photoresist layer with a first buried layer region pattern as a mask, in which a doping state of the first buried layer region is different from a doping state of other region of the substrate; forming a second oxide layer on the surface of the substrate and the first buried layer region; and forming a second buried layer region in the surface of the substrate through self alignment process by using the second oxide layer as a mask. The method disclosed by the present disclosure reduces the complexity of the buried layer procedures and the cost thereof, as well as the probability of crystal defects.

16 Claims, 5 Drawing Sheets

SEMICONDUCTOR DEVICE AND METHOD FOR FABRICATING SEMICONDUCTOR BURIED LAYER

FIELD OF THE INVENTION

The present disclosure relates to semiconductor fabricating technology, and in particular to a semiconductor device and a method for fabricating a semiconductor buried layer.

BACKGROUND OF THE INVENTION

Semiconductor buried layer technology is widely used in manufacturing integrated circuit, in particular in integrated circuit process for triodes which have high performance requirements. With large scale integrated circuits and complex processes, the development of buried layer technology will influence the performance of integrated circuits and the development of fabrication processes.

The buried layer technology, which is mainly applied to the fabrication process of bipolar junction transistors (BJT), may reduce power loss and parasitic capacitance by reducing on-resistance of devices, and improve the efficiency of the devices. To be specific, for a bipolar junction device (BJT device), the presence of a buried layer may reduce the resistance of the collector and increase the characteristics frequency Ft. Moreover, the presence of an N-type heavily doped buried layer may prevent a lightly doped collector region with a thin epitaxial from being changed into a space barrier region by reverse bias voltage. For a MOS device, the presence of the buried layer increases a base region concentration of a parasitic-PNP transistor and is capable of avoiding a low impedance path "Latch-up". Latch-up indicates a low impedance path between a power supply VDD and a ground wire GND (VSS) in a CMOS wafer, which is generated by the interaction of the parasitic PNP and NPN bipolar device. The presence of Latch-up may create a large current between the VDD and the GND.

There are mainly two traditional buried layer processes: the first process is forming a buried layer with different impurity types by performing selective implanting to the substrate through photolithography process, and the second process is achieving self alignment implanting of a buried layer by taking a low pressure deposition silicon nitride layer (LPSIN layer) as the hard mask and taking an oxide layer which grows relatively thick as the mask. The steps of these two processes will be described briefly in the following, in conjunction with the drawings.

The procedures of the first traditional buried layer process include the following steps as shown in FIGS. 1 to 6:

1. preparing a substrate 11; forming a thick oxide layer 12 on the substrate 11 by thermal oxidation process; forming an antireflection layer 13 and a photoresist layer 14; and removing portions of the oxide layer 12, antireflection layer 13, and photoresist layer 14 on a region where a first buried layer is to be implanted, by photolithography and corrosion process, thereby forming a first buried layer region pattern in the oxide layer 12 (referring to FIG. 1);

2. removing the antireflection layer 13 and the photoresist layer 14 (referring to FIG. 2);

3. forming a thin oxide layer 15 on the surface of the substrate where the first buried layer is to be implanted, by a thermal oxidation process (referring to FIG. 3);

4. forming the first buried layer 16 in the substrate through ion implanting by using the oxide layer 12 as a mask layer (referring to FIG. 4, in which the first buried layer 16 is doped with an N-type dopant, for example); and 5. removing the oxide layer 12 on the surface of the substrate where a second buried layer is to be implanted, by photolithography and corrosion process (referring to FIGS. 5); and 6. repeating steps 3 and 4 to form a second buried layer 17 in the substrate (referring to FIG. 6, in which the second buried layer is doped with a P-type dopant, for example).

In fabricating a buried layer by this method, a photolithography process is required to be carried out twice, which increases the cost of photolithography. Moreover, the development cycle of the entire process is prolonged and the overall process cost is high.

The procedures of the second traditional buried layer process include the following steps as shown in FIGS. 7 to 11:

1. preparing a substrate 21; forming a first oxide layer 22 on the substrate 21 by thermal oxidation process; depositing an LPSIN layer 23; and defining an N-type doped region by photolithography process to form a first buried layer region pattern in the LPSIN layer 23 (referring to FIG. 7);

2. implanting an N-type impurity to form a first buried layer 24 in the substrate (referring to FIG. 8);

3. forming a thick second oxide layer 25 on the first buried layer region 24 through thermal oxidation process by using the LPSIN layer 23 as a mask (referring to FIG. 9);

4. removing the LPSIN layer 23 on the region where a P-type doping is required, and implanting P-type impurity by using the second oxide layer 25 as a mask to form a second buried layer 26 in the substrate (referring to FIGS. 10); and 5. removing the first oxide layer 22 and the second oxide layer 25 (referring to FIG. 11).

In fabricating a semiconductor buried layer by this method, the thickness of the second oxide layer 25 is generally about 5800 Å; and after removing the first oxide layer 22 and the second oxide layer 25, the thickness difference (the step) between the first buried layer 24 and the second buried layer 26 is generally about 2900 Å.

Moreover, during the above buried layer processing, crystal defects may occur when a buried layer is fabricated by the second traditional buried layer process, and as a result the electrical performance of a semiconductor device may be reduced and unable to meet the design requirements.

SUMMARY OF THE INVENTION

According to an embodiment of the present disclosure, a semiconductor device and a method for fabricating a buried layer thereof are provided, by which the complexity of the buried layer process and the process cost are reduced compared with the first traditional buried layer process, and by which the generation of crystal defects is reduced compared with the second traditional buried layer process.

For achieving the objects described above, an embodiment of the present disclosure provides the following technical solution:

A method for fabricating a semiconductor buried layer, comprising:

preparing a substrate which includes a first oxide layer;

forming a first buried layer region in a surface of the substrate by using a photoresist layer and a first buried layer region pattern as the mask, in which a doping state of the first buried layer region is different from a doping state of other region of the substrate;

forming a second oxide layer on the surface of the substrate and the first buried layer region; and forming a second buried layer region in the surface of the substrate through self alignment process by using the second oxide layer as the mask.

Preferably, the doping state includes doping concentration and impurity type.

Preferably, a first region of the second oxide layer covers the first buried layer region and a second region of the second oxide layer covers a region of the substrate different than the first region, and a thickness of the first region is greater than a thickness of the second region.

Preferably, the method further includes removing the first oxide layer and the second oxide layer after forming the second buried layer region.

Preferably, process conditions for forming the first buried layer region may include the following: antimony as an implanted ion, an implanting energy of 40 keV, a doping dosage of 1E15 $cm^{-3}$, and a doping concentration of 5E16 $cm^{-3}$.

Preferably, the second oxide layer is formed by wet oxidation process.

Preferably, the second oxide layer is formed at a temperature of about 815° C.

Preferably, the thickness of the first region is about 2500 Å, and the thickness of the second region is about 600 Å.

An embodiment of the present disclosure further discloses a semiconductor device, comprising:

a substrate, which includes a first oxide layer;

a first buried layer region located in the surface of the substrate, in which a doping state of the first buried layer region is different from a doping state of other region of the substrate; and a second buried layer region located in the surface of the substrate and formed through self alignment process by using a second oxide layer located on the first buried layer region as the mask.

Preferably, a first region of the second oxide layer covers the first buried layer region and a second region of the second oxide layer covers the other region of the substrate, and a thickness of the first region is greater than a thickness of the second region.

The above embodiments may have the following advantages. In particular, thermal oxidation rates of regions having different impurity concentrations differ due to the differences in their impurity concentrations. In the above embodiments, the thickness of the first portion of the second oxide layer covering the first buried layer region is greater than that of the second portion of the second oxide layer covering the other region of the substrate. During the implanting of the second buried layer region, the impurity ions may pass through the first oxide layer but do not pass through the second oxide layer, so that the self alignment implanting can be achieved by taking the second oxide layer as the mask, which reduces photolithography once, simplifies the procedures and reduces the process cost.

According to the embodiments of the present disclosure, the impurity concentration difference is utilized to vary the thickness of the second oxide layers formed in different regions, and during forming of the second oxide layer, LPSIN layer is not used as the mask, avoiding the compressive stress against the substrate caused by the depositing of the LPSIN and reducing the stress applied against the substrate during forming of the second oxide layer, so that the factors causing crystal defects are suppressed and the occurrence of crystal defects is lowered.

BRIEF DESCRIPTION OF THE DRAWINGS

The above described objects and other objects, features and advantages are described with reference to the drawings. In all drawings, the similar part is indicated by the same reference number. The drawings are not intentionally drawn to actual scale, as the emphasis of which is to show the main idea of the present disclosure.

DETAILED DESCRIPTION OF THE INVENTION

To make the above object, features and advantages of the invention more easily understood, in the following, particular exemplary embodiments will be illustrated in detail in conjunction with the drawings.

More specific details will be set forth in the following descriptions for sufficient understanding of the disclosure, however the invention can also be implemented in other ways different from the way described herein. Similar extensions can be made by those of ordinary in the art without departing from the spirit of the invention, therefore the invention is not limited to any particular embodiments disclosed herein.

When describing the embodiments of the invention in detail, for ease of illustration, two-dimensional sectional views showing the structure of the device are illustrated. The illustrated views are only examples, which should not be understood as limiting the scope of the invention. Furthermore, in an actual manufacture process, three-dimensional sizes, i.e. length, width and depth, should be considered.

As described in the background section, crystal defects frequently exist in semiconductor devices fabricated by the second traditional buried layer process. It was found by the inventor that one of the main reasons leading to crystal defects is that the second oxide layer is formed by using the LPSIN layer as the mask. In such process, during the forming of the second oxide layer, the mask which is peripheral to the second oxide layer is divided into two different layers, the first oxide layer and the LPSIN layer. Due to the presence of the LPSIN layer, the substrate is subjected to a compressive stress from the LPSIN layer. Moreover, another stress is also generated against the substrate by the volume expansion of the second oxide layer at the side wall of the LPSIN layer. The thicker the second oxide layer, the larger the stress against the substrate caused by the volume expansion. The presence of these stresses are factors causing crystal defects in the semiconductor devices thus produced.

Based on this, the present disclosure provides a method for fabricating a semiconductor buried layer, which includes the following steps:

preparing a substrate which includes a first oxide layer;

forming a first buried layer region in a surface of the substrate by using a photoresist layer and a first buried layer region pattern as a mask, in which a doping state of the first buried layer region is different from a doping state of other region of the substrate;

forming a second oxide layer on the surface of the substrate and the first buried layer region; and forming a second buried layer region in the surface of the substrate through self alignment process by using the second oxide layer as the mask.

In the following, the method for fabricating semiconductor buried layer will be described in detail by using a triode as an example.

Figure 1:
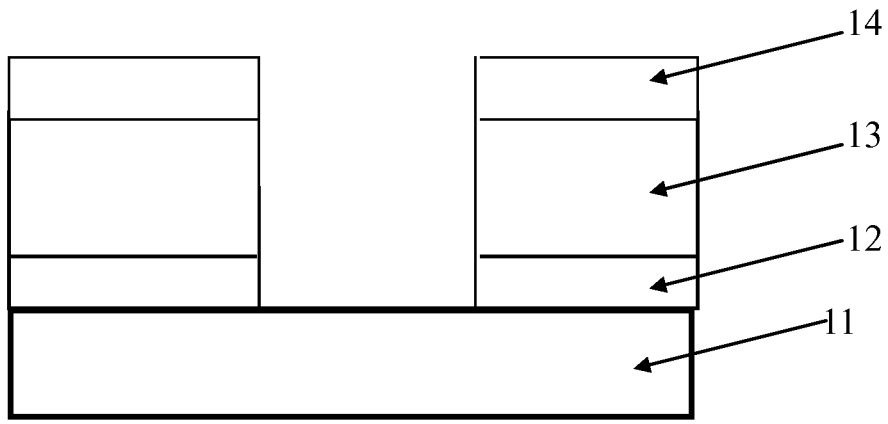
FIGS. 1 to 6 are the cross-section views of the first traditional buried layer process.
Figure 2:
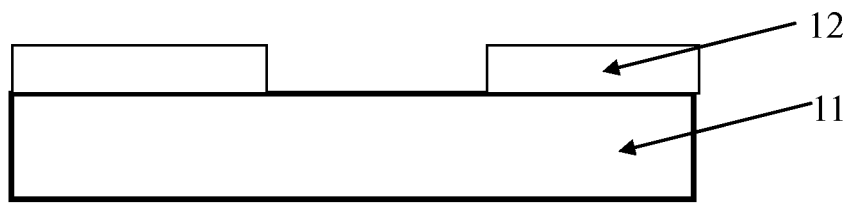
Figure 3:
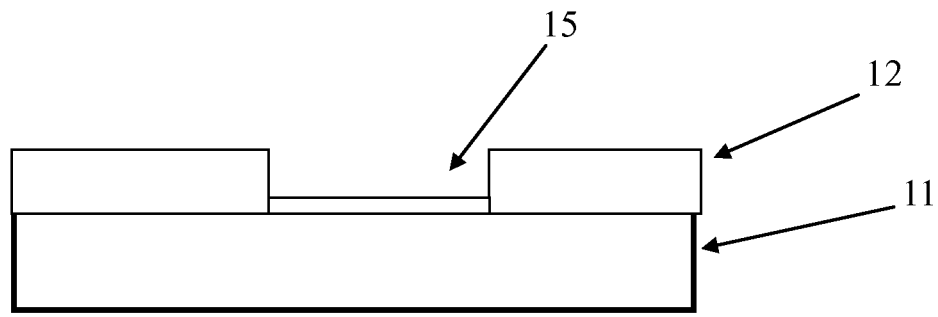
Figure 4:
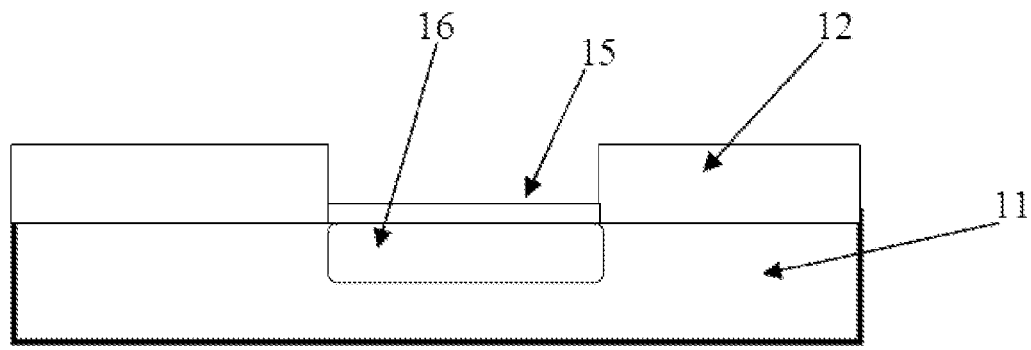
Figure 5:
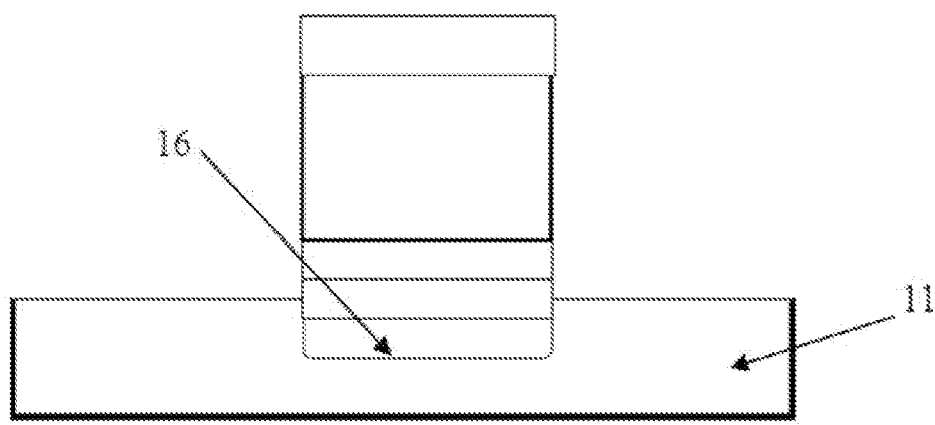
Figure 6:
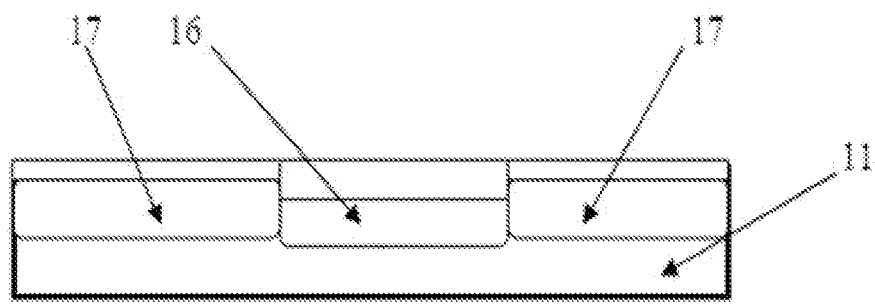
Figure 7:
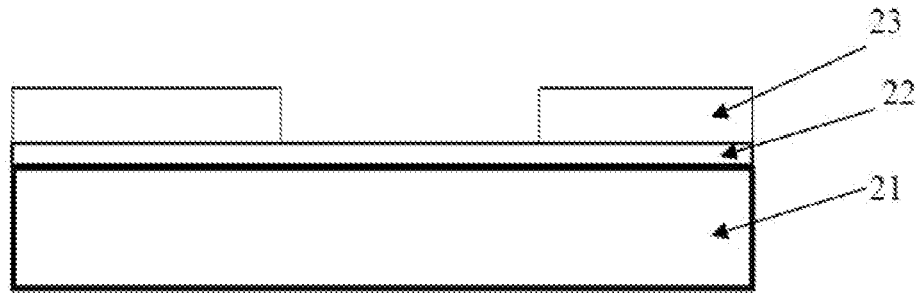
FIGS. 7 to 11 are the cross-section views of the second traditional buried layer process.
Figure 8:
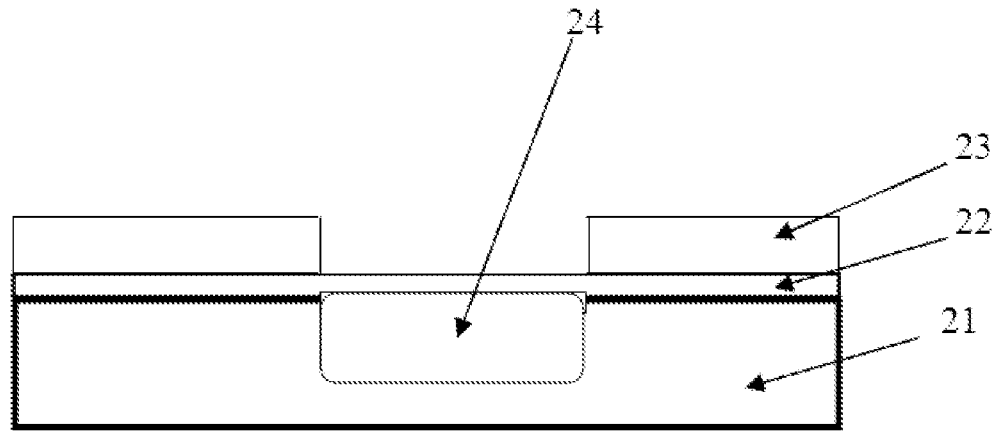
Figure 9:
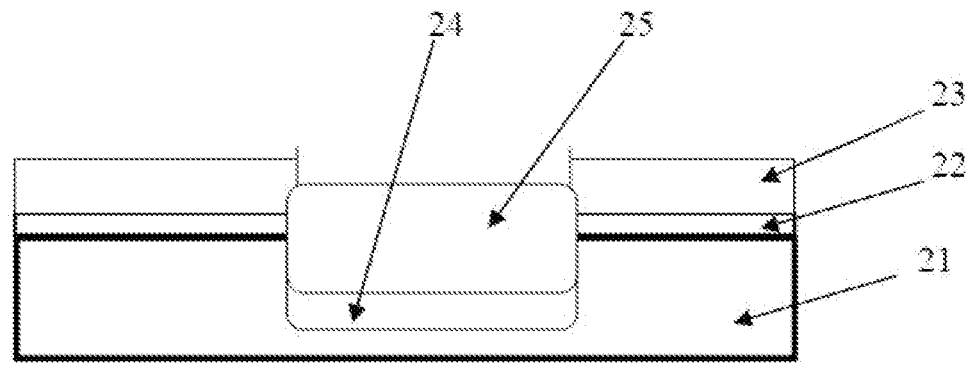
Figure 10:
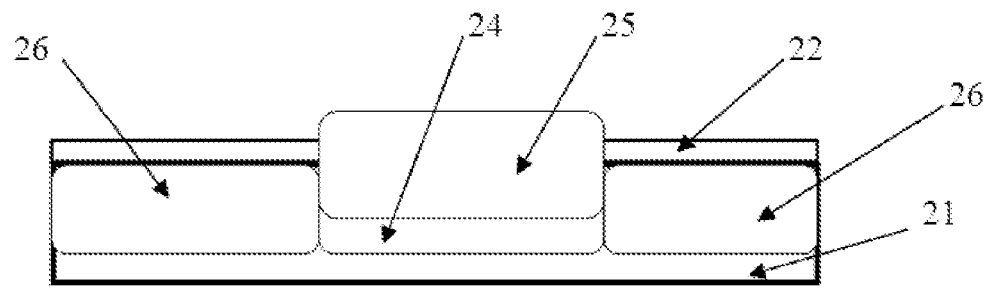
Figure 11:
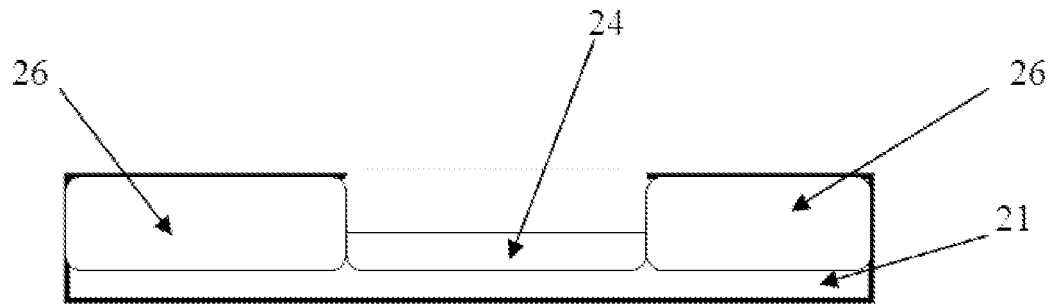
Figure 12:
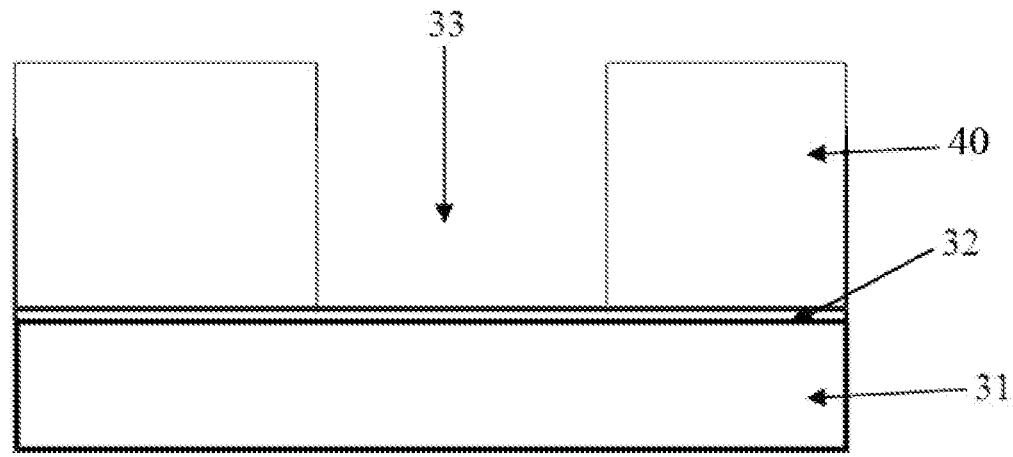
FIGS. 12 to 16 are the cross-section views of the method for fabricating semiconductor buried layer disclosed by the embodiment of the present disclosure.

As shown in FIG. 12, a substrate 31 is prepared. The substrate 31 may include a semi-conductive element, such as silicon or silicon germanium (SiGe) with monocrystal, polycrystalline, or amorphous structure; and may also include hybrid semiconductor structure, such as silicon carbide, indium antimonide, lead telluride, indium arsenide, indium phosphide, gallium arsenide or gallium antimonide, alloy semiconductor or the combination thereof. The substrate 31 may also be silicon on insulator (SOI). Furthermore, the semiconductor substrate 31 may also include other material, such as a multi-layer structure of an epitaxial layer or a buried layer. Although several examples of the materials forming the substrate 31 are described here, any other material capable of serving as a semiconductor substrate will fall within the spirit and scope of the present disclosure. In this embodiment, the substrate may be a silicon substrate.

The substrate 31 includes a first oxide layer 32 which is formed thereon through thermal oxidation. The first oxide layer 32 may include, but is not limited to, one or the combination of at least two of silicon oxide, silicon oxycarbide and silicon oxynitride, and is preferably silicon oxide. In this embodiment, the thickness of the first oxide layer 32 may be relatively thin. Hereinafter, the illustration of the thin first oxide layer 32 will be omitted to simplify the cross-sectional views.

A first buried layer region pattern 33 is formed in the first oxide layer 32 by spin coating a photoresist layer 40 on the surface of the substrate 31 including the first oxide layer 32, exposing and developing.

Figure 13:
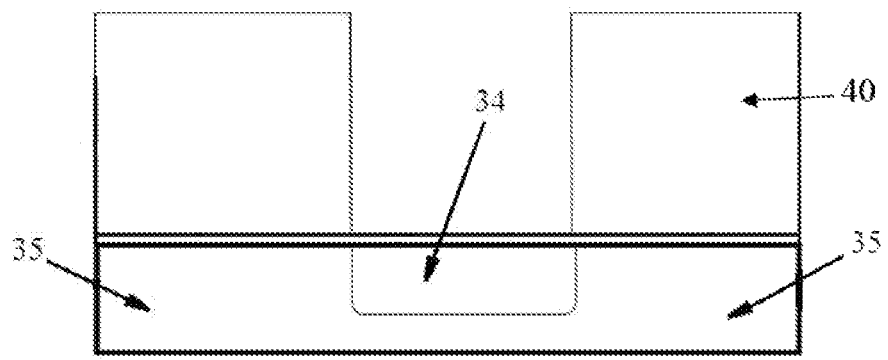

As shown in FIG. 13, a first buried layer region 34 is formed at the first buried layer region pattern 33 in the surface of the substrate 31 by using the photoresist layer 40 as a mask, so that a doping state of the first buried layer region 34 is different from that of other region 35 of the substrate 31. The doping state includes doping concentration or impurity type. For example, the doping type of the first buried layer region 34 may be of N-type or P-type, and the impurity in the other region 35 of the substrate outside the first buried layer region 34 can be selected according to specific application environment of the semiconductor device. The region 35 may also be undoped. Furthermore, the doping concentration of the first buried layer region 34 may be greater than or less than that of the other region 35.

Particularly, the doping process of the first buried layer region may be selected from the following: doping in melt growth, gas phase doping, neutron transmutation doping, ion implantation, surface coating doping, etc. In the embodiment, ion implantation is selected, in which the doping type is of N-type, and the dopant ion may be phosphorus or another pentavalent element. The dopant ion in one embodiment is antimony.

The photoresist layer 14 is removed after forming the first buried layer region 34.

Figure 14:
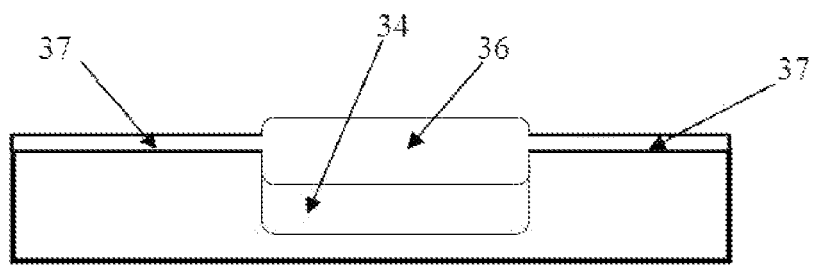

Referring to FIG. 14, a second oxide layer is formed on the surface of the substrate including the first buried layer region 34. A first region 36 of the second oxide layer covers the first buried layer region and a second region 37 of the second oxide layer covers other region of the substrate.

The term "in the surface of the substrate" indicates the region extending downwards for a certain depth from the surface of the substrate 31, which belongs to a part of the substrate, and the term "on the surface of the substrate" indicates the region extending upwards from the surface of the substrate 31, which does not belong to the substrate itself.

In this embodiment, the doping concentrations of the substrate 31 corresponding to the first region 36 and the second region 37 are different. In one example, the doping concentration of the substrate 31 corresponding to the first region 36 (i.e., region 34) is 5E16 cm$^{-3}$, and the doping concentration of the substrate 31 corresponding to the second region 37 (i.e., region 35) is 4E13 cm$^{-3}$, that is to say, the doping concentration of the first region 36 is greater than that of the second region 37.

Since the thermal oxidation rate differs on the silicon substrate with different impurity concentrations, the thicknesses of the oxide layers formed on the silicon substrate with different impurities are different. In this embodiment, the thickness of the first region 36 of the second oxide layer is different from that of the second region 37.

In this embodiment, since the first region 36 of the second oxide layer serves as a blocking layer for a second ion implanting to achieve the self alignment effect for the second ion implanting, it is necessary for the thickness of the first region 36 to be greater than that of the second region 37. In order to achieve this object, a suitable implanting condition of the first buried layer region 34, and a suitable thermal oxidation process with a suitable temperature and duration of the thermal oxidation should be selected. Preferably, the process conditions of forming the first buried layer region 34 may include the following: an implanted ion of antimony, an implanting energy of 40 keV, a doping dosage of 1E15 cm$^{-3}$ and a doping concentration of 5E16 cm$^{-3}$. On the other hand, the doping concentration at the region 35 of the substrate may be 4E13 cm$^{-3}$, and the thermal oxidation may be performed by a wet oxidation process under the temperature of 815° C.

Because the doping concentration of the region 35 is greater than that of the region 34, the thickness of the first region 36 of the second oxide layer formed by the above process is greater than that of second region 37. In one embodiment, the thickness of the first region 36 may be about 2500 Å, and the thickness of the second region 37 may be about 600 Å.

Figure 15:
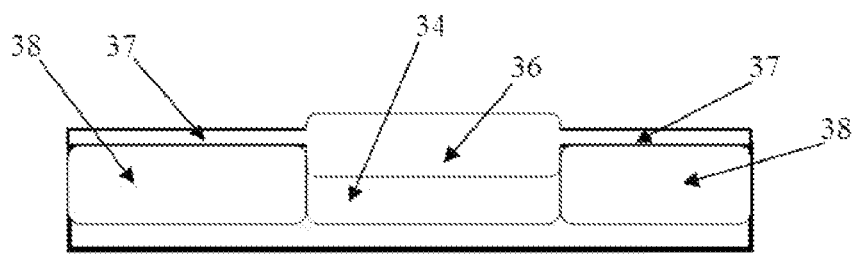

Referring to FIG. 15, after forming the second oxide layer, a second buried layer region 38 is formed in the surface of the substrate through self alignment process by using the second oxide layer as a mask.

Specifically, the second buried layer region 38 is formed by the ion implanting process. The implanted impurity type is opposite to the impurity type implanted into the first buried layer region 34. In one embodiment, the doping type of the second buried layer region 38 is of P-type, in which the doped ion may be boron or other trivalent elements.

Figure 16:
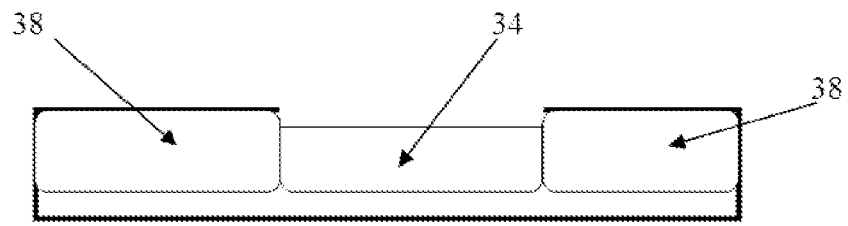

As shown in FIG. 16, after the implanting of the P-type impurity ion and forming the second buried layer region 38, the first oxide layer 32 and the second oxide layer including the first region 36 and the second region 37 are removed.

Specifically, the first oxide layer and the second oxide layer are removed by wet etching to expose the surface of the substrate 31 with the first buried layer region 34 and the second buried layer region 38. After removing the oxide layers, the thickness difference between the second buried layer region 38 and the first buried layer region 34 (that is the step between the first buried layer region 34 and the second buried layer region 38) is about 1000 Å. In other words, the thickness of the second buried layer region 38 may be greater by 1000 Å than that of the first buried layer region 34.

According to this embodiment, based on the principle that the thermal oxidation rate differs in the regions with different impurity concentration, the thickness of the first region 36 of the second oxide layer covering the first buried layer region 34 is greater than that of the second region 37 of the second oxide layer covering other region 35 of the substrate 31; and during the implanting of the second buried layer region 38, the implanted ions can pass through the thin second oxide layer 37 but fail to pass through the thicker oxide layer 36, so that the self alignment implanting will be achieved simply by using the thicker oxide layer 36 as the mask. Further, the above method reduces the steps of photolithography, and thus simplifies the procedures and reduces the process cost in comparison with the first traditional buried layer process.

Additionally, according to this embodiment, the impurity concentration difference between regions of the substrate is utilized to form the oxide layer to have different thicknesses in different regions. During the forming of the second oxide layer, there is no overall volume expansion and, accordingly, no stress applied against the substrate. Compared with the second traditional buried layer process, the disclosed embodiment does not utilize an LPSIN layer as the mask to form the second oxide layer, avoiding the compression stress against the substrate caused by the deposition of the LPSIN layer and the stress against the substrate caused by volume expansion of the second oxide layer. Since the stresses causing crystal defects are suppressed, the occurrence of crystal defects is reduced.

The semiconductor device fabricated by the method for fabricating semiconductor buried layer described above includes the structures as follows:

a substrate which includes a first oxide layer;

a first buried layer region located in the surface of the substrate, in which a doping state of the first buried layer region is different from a doping state of other region of the substrate; and a second buried layer region located in the surface of the substrate, which is formed through self alignment process by using a second oxide layer located on the first buried layer region as the mask.

Particularly, the portion of the second oxide layer covering the first buried layer region is a first region and the portion of the second oxide layer covering other region of the substrate is a second region, and the thickness of the first region is greater than that of the second region.

The above embodiments are only preferred embodiments of the present disclosure, and are not intended to limit the present disclosure in any form.

Although the invention is disclosed by the above preferred embodiments, it is not intended to limit the invention. The technical solution of the invention can be varied and changed or be modified as an equivalent embodiment with equivalent variations by those of ordinary skill in the art by utilizing the above-disclosed methods and technical content, without departing from the scope of the technical solution of the invention. Therefore, any contents without departing from the technical solution of the invention, simple modification, equivalent variations and modifications according to the technical essence of the invention fall within the scope of protection of the technical solution of the invention.

What is claimed is:

1. A method for fabricating a semiconductor buried layer, comprising:
   providing a substrate which includes a first oxide layer formed thereon;
   forming a first buried layer region in a surface of the substrate by using process including:
      forming a photoresist layer on the first oxide layer, the photoresist having a first buried layer region pattern that exposes a portion of the first oxide layer;
      by doping using the photoresist layer as a mask, forming the first buried layer region covered by the exposed portion of the first oxide layer, wherein a doping state of the first buried layer region is different from a doping state of other region of the substrate; and
      removing the photoresist layer;
   forming a second oxide layer on the surface of the substrate and the first buried layer region, the second oxide layer having a first region covering the first buried layer region and a second region covering a portion of the substrate different from the first buried layer region, a thickness of the first region being greater than a thickness of the second region; and
   forming a second buried layer region in the surface of the substrate and covered by the second region of the second oxide layer, through a self alignment process by doping using the second oxide layer as the mask.

2. The method for fabricating a semiconductor buried layer according to claim 1, wherein the doping state includes doping concentration and impurity type.

3. The method for fabricating a semiconductor buried layer according to claim 1, further comprising:
   removing the first oxide layer and the second oxide layer after forming the second buried layer region, to expose a top surface of both of the first buried layer region and the second buried layer region.

4. The method for fabricating a semiconductor buried layer according to claim 1, wherein process conditions for forming the first buried layer region include: antimony as an implanted ion, an implanting energy of 40 keV, a doping dosage of 1E15 $cm^{-3}$, and a doping concentration of 5E16 $cm^{-3}$.

5. The method for fabricating a semiconductor buried layer according to claim 4, wherein the second oxide layer is formed by wet oxidation process, an oxidation rate of the first region of the second oxide layer being different from an oxidation rate of the second region of the second oxide layer.

6. The method for fabricating a semiconductor buried layer according to claim 5, wherein the second oxide layer is formed at a temperature of about 815° C.

7. The method for fabricating a semiconductor buried layer according to claim 1, wherein the thickness of the first region is about 2500 Å, and the thickness of the second region is about 600 Å.

8. A semiconductor device, comprising:
   a substrate;
   a first buried layer region located in the surface of the substrate, wherein the first buried layer region is formed by using a process including:
      forming a first oxide layer on the substrate;
      forming a photoresist layer on the first oxide layer, the photoresist having a first buried layer region pattern that exposes a portion of the first oxide layer;
      by doping using the photoresist layer as a mask, forming the first buried layer region covered by the exposed portion of the first oxide layer, wherein a doping state of the first buried layer region is different from a doping state of other region of the substrate; and
      removing the photoresist layer; and
   a second buried layer region located in the surface of the substrate, wherein the second buried layer region is formed through a self alignment process by using a second oxide layer located on the first buried layer region as the mask, and the self alignment process includes:
      forming the second oxide layer on the surface of the substrate and the first buried layer region, the second oxide layer having a first region covering the first buried layer region and a second region covering a portion of the substrate different from the first buried layer region, a thickness of the first region being greater than a thickness of the second region; and forming the second buried layer region in the surface of the substrate and covered by the second region of the second oxide layer, by doping using the second oxide layer as the mask.

9. The method for fabricating a semiconductor buried layer according to claim 3, wherein the thickness of the first region is about 2500 Å, and the thickness of the second region is about 600 Å.

10. The method for fabricating a semiconductor buried layer according to claim 4, wherein the thickness of the first region is about 2500 Å, and the thickness of the second region is about 600 Å.

11. The method for fabricating a semiconductor buried layer according to claim 6, wherein the thickness of the first region is about 2500 Å, and the thickness of the second region is about 600 Å.

12. The method for fabricating a semiconductor buried layer according to claim 6, wherein the thickness of the first region is about 2500 Å, and the thickness of the second region is about 600 Å.

13. The method for fabricating a semiconductor buried layer according to claim 1, wherein during the forming of the second buried layer region, doped impurity ions pass through the first region of the second oxide layer and substantially do not pass through the first region of the second oxide layer.

14. The method for fabricating a semiconductor buried layer according to claim 1, wherein the second buried layer region is located outside the first buried layer region and contacts the first buried layer region.

15. The method for fabricating a semiconductor buried layer according to claim 3, wherein after removing the first oxide layer and the second oxide layer, the top surface of the first buried layer region and the top surface of the second buried layer region have a step of about 1000 Å therebetween.

16. The method for fabricating a semiconductor buried layer according to claim 4, wherein the second buried layer region has a doping type of P-type, and has doped ions of boron or another trivalent element.

* * * * *